United States Patent
Yeh et al.

(10) Patent No.: US 12,310,015 B2
(45) Date of Patent: May 20, 2025

(54) SEMICONDUCTOR MEMORY DEVICE

(71) Applicant: UNITED MICROELECTRONICS CORP., Hsin-Chu (TW)

(72) Inventors: Yu-Jen Yeh, Taichung (TW); Hung-Hsun Shuai, Tainan (TW); Chih-Jung Chen, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 403 days.

(21) Appl. No.: 17/676,209

(22) Filed: Feb. 20, 2022

(65) Prior Publication Data

US 2023/0225120 A1    Jul. 13, 2023

(30) Foreign Application Priority Data

Jan. 11, 2022   (TW) .................................. 111101109

(51) Int. Cl.
*H10B 41/35*   (2023.01)
*H10B 41/60*   (2023.01)
*H10D 30/01*   (2025.01)
*H10D 30/68*   (2025.01)

(52) U.S. Cl.
CPC ............. *H10B 41/35* (2023.02); *H10B 41/60* (2023.02); *H10D 30/0411* (2025.01); *H10D 30/6892* (2025.01)

(58) Field of Classification Search
CPC ........ H10B 41/30; H10B 41/35; H10B 69/00; H10B 41/10; H10B 43/27
See application file for complete search history.

(56) References Cited

U.S. PATENT DOCUMENTS

| | | | |
|---|---|---|---|
| 10,418,451 B1 | 9/2019 | Do | |
| 11,316,024 B2 * | 4/2022 | Wang | ................ H01L 29/66825 |
| 2007/0170490 A1 | 7/2007 | Moon | |
| 2008/0083945 A1 | 4/2008 | Klinger | |
| 2012/0063233 A1 * | 3/2012 | Lee | ......................... H10B 41/30 |
| | | | 365/189.11 |
| 2016/0218195 A1 | 7/2016 | Wu | |
| 2017/0032846 A1 | 2/2017 | Widjaja | |
| 2019/0206882 A1 | 7/2019 | MacPeak | |

FOREIGN PATENT DOCUMENTS

| | | |
|---|---|---|
| CN | 105990359 B | 2/2019 |
| JP | 2007-194638 A | 8/2007 |
| JP | 2018-507548 A | 3/2018 |
| JP | 2021-523566 A | 9/2021 |
| TW | 201013903 A1 | 4/2010 |
| WO | 2016/118532 A1 | 7/2016 |
| WO | 2019/217022 A1 | 11/2019 |

* cited by examiner

*Primary Examiner* — Tony Tran
(74) *Attorney, Agent, or Firm* — Winston Hsu

(57) ABSTRACT

A memory cell includes a substrate, a floating gate on the substrate, a control gate on the floating gate, a first dielectric layer between the floating gate and the control gate, an erase gate merged with the control gate and disposed on a first sidewall of the floating gate, a second dielectric layer between the floating gate and the erase gate, a select gate on an opposite second sidewall of the floating gate, a spacer between the select gate and the control gate and between the select gate and the floating gate, a source doping region in the substrate and adjacent to the first sidewall of the floating gate, and a drain doping region in the substrate and adjacent to the select gate.

5 Claims, 7 Drawing Sheets

SEMICONDUCTOR MEMORY DEVICE

BACKGROUND OF THE INVENTION

1. Field of the Invention

The present invention relates to the field of semiconductor technology, in particular to a flash memory device.

2. Description of the Prior Art

A flash memory is a type of memory that can be erased and reprogrammed in blocks instead of one byte at a time. A typical flash memory comprises a memory array, which includes a large number of memory cells. Each of the memory cells includes a floating gate field-effect transistor capable of holding charge. The cells are usually grouped into blocks. Each of the cells within a block can be electrically programmed in a random basis by charging the floating gate. The data in a cell is determined by the presence or absence of the charge in the floating gate. The charge can be removed from the floating gate by a block erase operation.

Common types of flash memory cells include stacked-gate flash memory cells and split-gate flash memory cells (e.g., a third generation SUPERFLASH (ESF3) memory cell). Split-gate flash memory cells have lower power consumption, higher injection efficiency, less susceptibility to short channel effects, and over erase immunity compared to stacked-gate flash memory cells. However, the existing ESF3 memory architecture has disadvantages such as source line loading effect.

SUMMARY OF THE INVENTION

It is one object of the present invention to provide an improved semiconductor memory device in order to solve the above-mentioned deficiencies or shortcomings of the prior art.

One aspect of the invention provides a semiconductor memory device including a substrate and device lines on the substrate. The device lines include a select gate (SG) line, a control gate (CG) line, an erase gate (EG) line, and a source line elongated in parallel along a first direction. The CG line is disposed between the EG line and the SG line. The EG line is merged with the CG line. The source line underlies the EG line in the substrate. The device lines define a plurality of memory cells.

Drain doping regions of the memory cells are disposed in the substrate and adjacent to the SG line. Bit line contacts are disposed on the plurality of drain doping regions of the plurality of memory cells, respectively. Source doping regions of the memory cells are electrically coupled to the source line in the substrate and disposed under the EG line. Source line contacts are disposed on the source doping regions of the memory cells, respectively. The source line contacts are aligned with the bit line contacts in a second direction that is orthogonal to the first direction.

According to some embodiments, each of the memory cells comprises a floating gate disposed under the CG line.

According to some embodiments, the EG line partially overlaps with the source line when viewed from above.

According to some embodiments, each of the source doping regions is disposed adjacent to a first sidewall of the floating gate.

According to some embodiments, the semiconductor memory device further includes a first dielectric layer disposed between the floating gate and the CG line.

According to some embodiments, the first dielectric layer comprises an oxide-nitride-oxide (ONO) dielectric layer.

According to some embodiments, the semiconductor memory device further includes a second dielectric layer disposed between the floating gate and the EG line.

According to some embodiments, the second dielectric layer is a silicon oxide layer.

According to some embodiments, the second dielectric layer is disposed only on the first sidewall of the floating gate.

According to some embodiments, the first dielectric layer is thicker than the second dielectric layer.

Another aspect of the invention provides a memory cell including a substrate; a floating gate disposed on the substrate; a control gate disposed on the floating gate; a first dielectric layer disposed between the floating gate and the control gate; an erase gate merged with the control gate and disposed on a first sidewall of the floating gate; a second dielectric layer disposed between the floating gate and the erase gate; a select gate disposed on an opposite second sidewall of the floating gate; a spacer disposed between the select gate and the control gate and between the select gate and the floating gate; a source doping region disposed in the substrate and adjacent to the first sidewall of the floating gate; and a drain doping region disposed in the substrate and adjacent to the select gate.

According to some embodiments, the first dielectric layer is thicker than the second dielectric layer.

According to some embodiments, the first dielectric layer comprises an oxide-nitride-oxide (ONO) dielectric layer.

According to some embodiments, the second dielectric layer is a silicon oxide layer.

According to some embodiments, the erase gate partially overlaps with the source doping region.

According to some embodiments, the memory cell further includes a source line contact disposed on the source doping region; and a bit line contact disposed on the drain doping region.

According to some embodiments, the memory cell further includes an insulating layer between the substrate and the erase gate. The insulating layer has a thickness that increases from the first sidewall of the floating gate to the source line contact.

According to some embodiments, the erase gate is structurally integrated with the control gate.

According to some embodiments, the erase gate, the control gate, the floating gate, and the select gate are composed of polysilicon.

According to some embodiments, the memory cell further includes a select gate oxide layer disposed between the select gate and the substrate; and a floating gate oxide layer disposed between the floating gate and the substrate.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
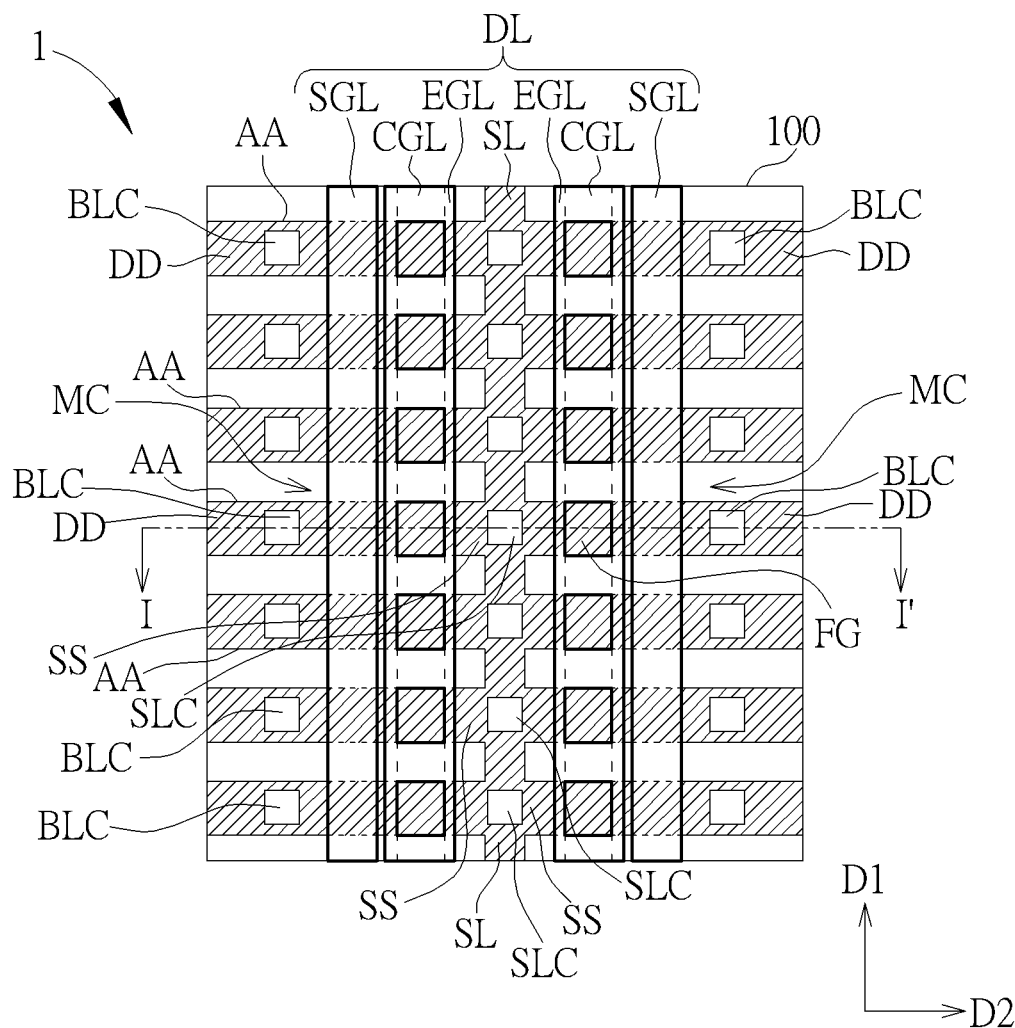
FIG. 1 is a schematic diagram showing a partial layout of a semiconductor memory device according to an embodiment of the present invention.
Figure 2:
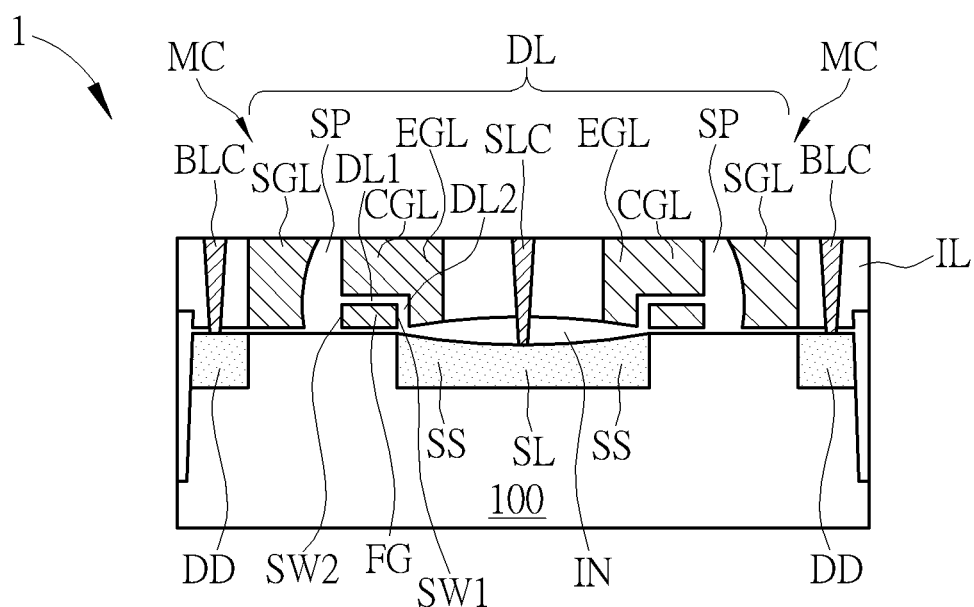
FIG. 2 is a schematic cross-sectional view taken along the line I-I' in FIG. 1.

Please refer to FIG. 1 and FIG. 2. FIG. 1 is a partial layout diagram of a semiconductor memory device 1 according to an embodiment of the present invention. FIG. 2 is a cross-sectional view taken along line I-I' in FIG. 1. As shown in FIG. 1 and FIG. 2, the semiconductor memory device 1 includes a substrate 100, for example, a P-type doped silicon substrate, but not limited thereto. Multiple device lines DL are provided on the substrate 100, including a select gate line SGL, a control gate line CGL, an erase gate line EGL, and a source line SL extending in parallel along the first direction D1.

According to an embodiment of the present invention, the control gate line CGL is disposed between the erase gate line EGL and the select gate line SGL, and the source line SL is located in the substrate 100 below the erase gate line EGL.

According to an embodiment of the present invention, the erase gate line EGL and the control gate line CGL are merged together and are structurally integrated.

It can be seen from FIG. 1 that multiple elongated active areas AA extending along the second direction D2 are provided in the substrate 100. According to an embodiment of the present invention, the source lines SL extending along the first direction D1 and the elongated active regions AA extending along the second direction D2 intersect. According to an embodiment of the present invention, the source line SL may be a heavily doped region, for example, an N+ heavily doped region, formed in the substrate 100.

According to an embodiment of the present invention, the device lines DL define a plurality of memory cells MC (formed on each elongated active area AA) spaced apart from each other along their lengths (or the first direction D1).

According to an embodiment of the present invention, multiple bit line contacts BLC are arranged along the first direction D1, and are respectively electrically connected to the drain doped regions DD of the memory cells MC. The drain doped regions DD are arranged in the substrate and adjacent to the select gate line SGL. According to an embodiment of the present invention, the semiconductor memory device 1 further includes multiple source line contacts SLC, which are respectively disposed on the source doped regions SS of the memory cells MC. The source line contacts SLC are aligned with the bit line contacts BLC, respectively along the second direction D2 that is orthogonal to the first direction D1.

According to an embodiment of the present invention, the source doped regions SS of the memory cells MC are electrically connected to the source lines SL in the substrate 100 and disposed under the erase gate lines EGL. According to an embodiment of the present invention, as shown in FIG. 1, when viewed from above, the erase gate line EGL partially overlaps with the source line SL.

According to an embodiment of the present invention, as shown in FIG. 1 and FIG. 2, each memory cell MC further includes a floating gate FG disposed under the control gate line CGL. According to an embodiment of the present invention, the erase gate line EGL, the control gate line CGL, the floating gate FG and the select gate line SGL are all formed of polysilicon. It can be seen from FIG. 2 that the two memory cells MC are mirror-symmetrical structures with respect to the middle source line SL. According to an embodiment of the present invention, each source doped region SS is disposed adjacent to the first sidewall SW1 of the floating gate FG.

According to an embodiment of the present invention, the semiconductor memory device 1 further includes a first dielectric layer DL1 disposed between the floating gate FG and the control gate line CGL. According to an embodiment of the present invention, for example, the first dielectric layer DL1 includes an oxide-nitride-oxide (ONO) dielectric layer, but is not limited thereto. According to an embodiment of the present invention, the semiconductor memory device 1 further includes a second dielectric layer DL2 disposed between the floating gate FG and the erase gate line EGL.

According to an embodiment of the present invention, for example, the second dielectric layer DL2 is a silicon oxide layer, but not limited thereto. According to an embodiment of the present invention, the second dielectric layer DL2 is only disposed on the first sidewall SW1 of the floating gate FG. According to an embodiment of the present invention, the first dielectric layer DL1 is thicker than the second dielectric layer DL2.

According to an embodiment of the present invention, as shown in FIG. 2, the select gate line SGL is disposed on the opposite second sidewall SW2 of the floating gate FG. Spacers SP, for example, silicon nitride spacers, may be provided between the select gate line SGL and the control gate line CGL and between the select gate line SGL and the floating gate FG.

According to an embodiment of the present invention, the semiconductor memory device 1 further includes an insulating layer IN disposed between the substrate 100 and the erase gate line EGL. The insulating layer IN has a thickness that increases in a direction from the first sidewall SW1 of the floating gate FG to the source line contact SLC. According to an embodiment of the present invention, the select gate line SGL, the control gate line CGL and the erase gate line EGL are surrounded by a dielectric layer IL, and the source line contact SLC and the bit line contact BLC are disposed in the dielectric layer IL.

Figure 3:
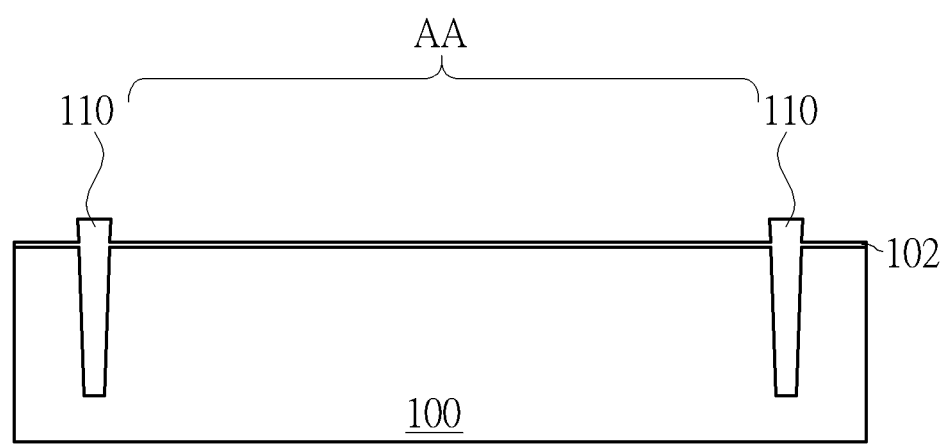
FIG. 3 to FIG. 12 are schematic diagrams illustrating a method for fabricating a semiconductor memory device according to an embodiment of the present invention.

FIG. 3 to FIG. 12 are schematic diagrams illustrating a method for fabricating a semiconductor memory device according to an embodiment of the present invention. As shown in FIG. 3, first, a substrate 100 is provided, for example, a P-type doped silicon substrate, but not limited thereto. A trench isolation structure 110 is formed in the substrate 100, which defines the active area AA. After the formation of the trench isolation structure 110, a silicon nitride pad layer (not shown) may be removed to expose the underlying silicon oxide pad layer 102. At this point, the trench isolation structure 110 may protrude from the top surface of the silicon oxide pad layer 102.

Figure 4:
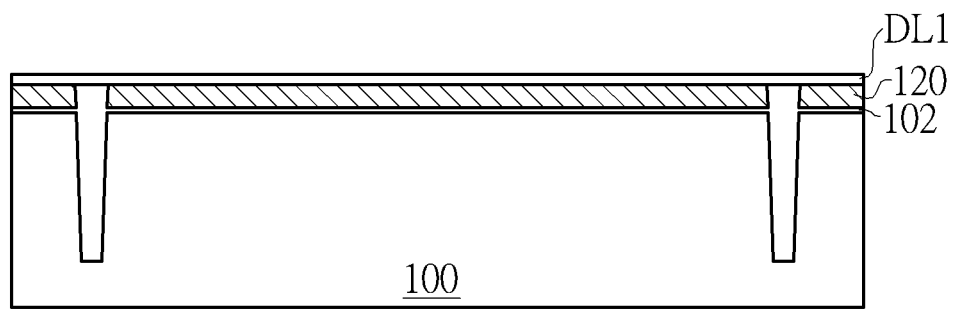

As shown in FIG. 4, a polysilicon layer 120 is then deposited on the substrate 100 in a blanket manner. The polysilicon layer 120 is then etched back. A first dielectric layer DL1, for example, an oxide-nitride-oxide thing (ONO) dielectric layer, is then formed on the polysilicon layer 120.

Figure 5:
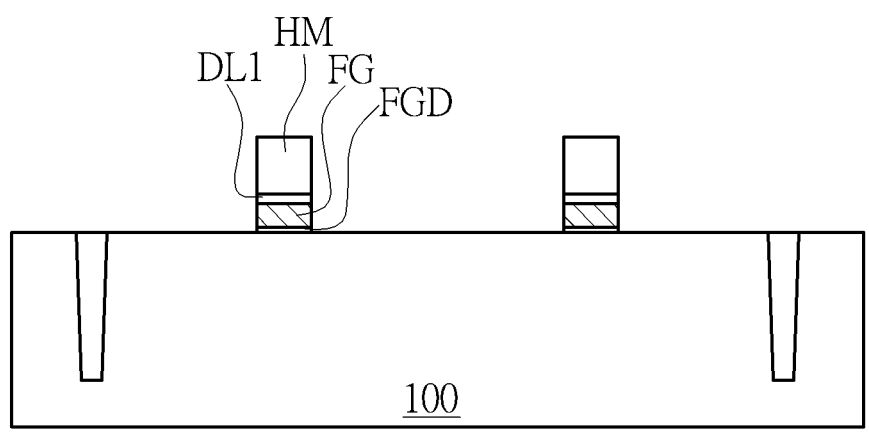

As shown in FIG. 5, using the hard mask pattern HM as an etch hard mask, an etching process is performed to pattern the first dielectric layer DL1, the polysilicon layer 120 and the silicon oxide pad layer 102, thereby forming a floating gate FG and a floating gate oxide layer FGD.

Figure 6:
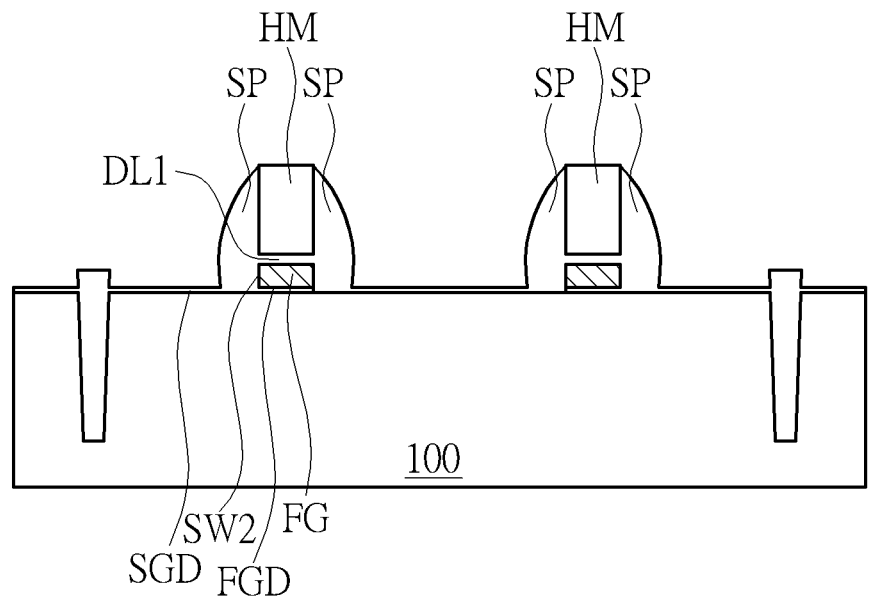

As shown in FIG. 6, subsequently, spacers SP, such as, but not limited to, silicon nitride spacers, are formed on the sidewalls of the floating gate FG and the hard mask pattern HM. At the same time, a select gate oxide layer SGD is formed on the surface of the substrate 100 adjacent to the floating gate FG.

Figure 7:
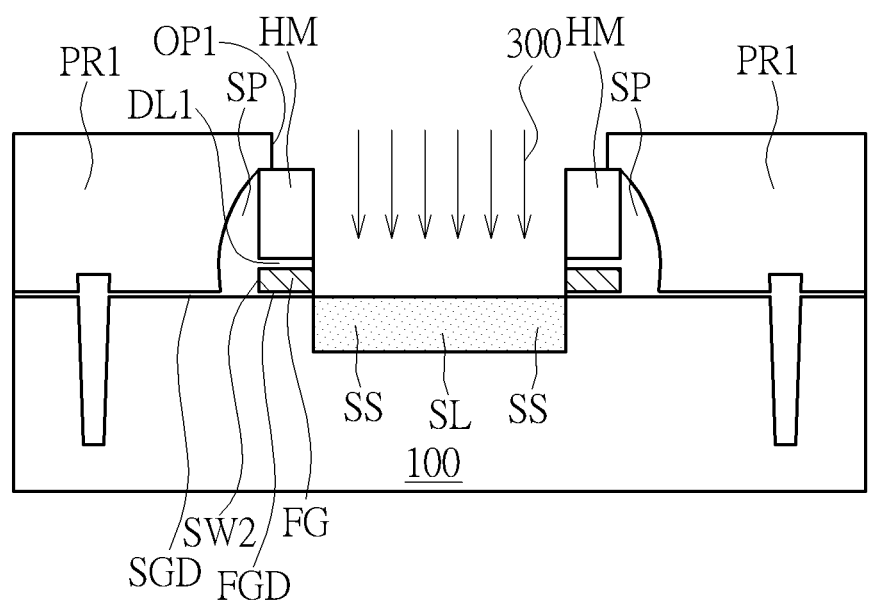

As shown in FIG. 7, a photoresist pattern PR1 is formed on the substrate 100. The photoresist pattern PR1 has an opening OP1 exposing a region between the two floating gates FG. An etching process is then performed to remove the spacers SP between the two floating gates FG through the opening OP1. An ion implantation process 300 is then performed, and dopants, for example, N-type dopants, are implanted into the substrate 100 through the opening OP1 to form a source doped region SS and a source line SL. Subsequently, the photoresist pattern PR1 is removed.

Figure 8:
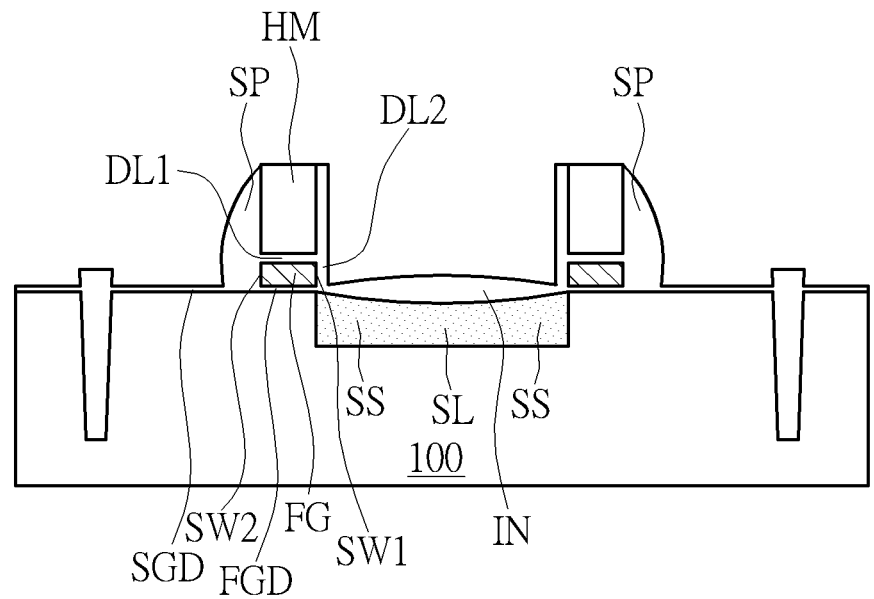

As shown in FIG. 8, a rapid thermal oxidation (RTO) process and a high-temperature oxidation (HTO) process are sequentially performed, and an insulating layer IN, for example, a silicon oxide layer, is formed on the substrate 100 between the two floating gates FG, and a second dielectric layer DL2, for example, a silicon oxide layer, is formed on the first sidewall SW1 of the floating gate FG.

According to an embodiment of the present invention, the thickness of the insulating layer IN is thinner near the first sidewall SW1 of the floating gate FG, and the thickness gradually increases toward the middle region between the two floating gates FG.

According to an embodiment of the present invention, the second dielectric layer DL2 is only disposed on the first sidewall SW1 of the floating gate FG. According to an embodiment of the present invention, the first dielectric layer DL1 is thicker than the second dielectric layer DL2.

Figure 9:
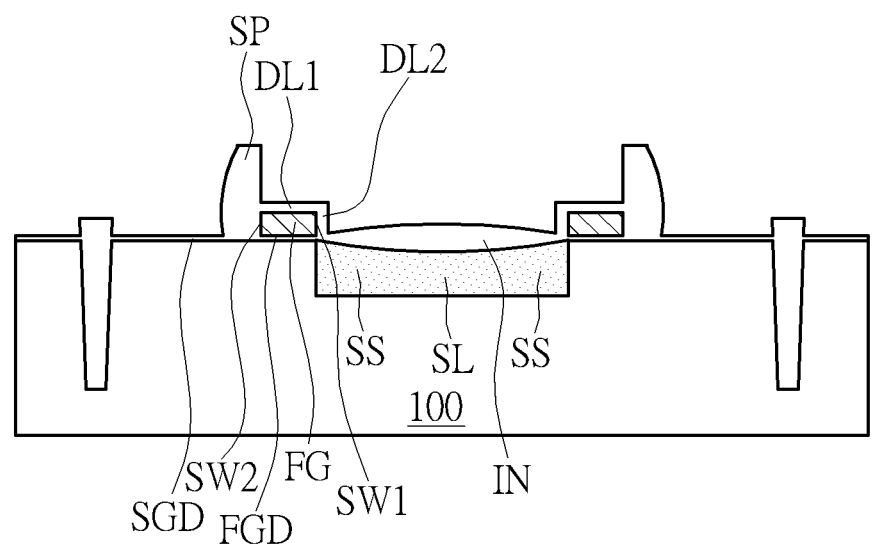

As shown in FIG. 9, a dry etching process is then performed to remove the hard mask pattern HM, thereby exposing the first dielectric layer DL1.

Figure 10:
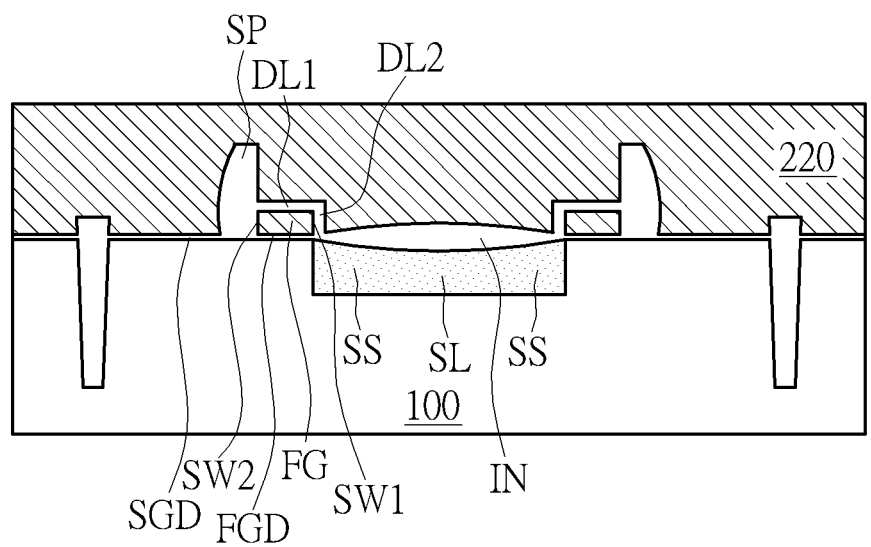

As shown in FIG. 10, subsequently, a polysilicon layer 220 is deposited on the substrate 100 in a blanket manner. The polysilicon layer 220 covers the spacers SP, the first dielectric layer DL1, the second dielectric layer DL2, and the insulating layer IN.

Figure 11:
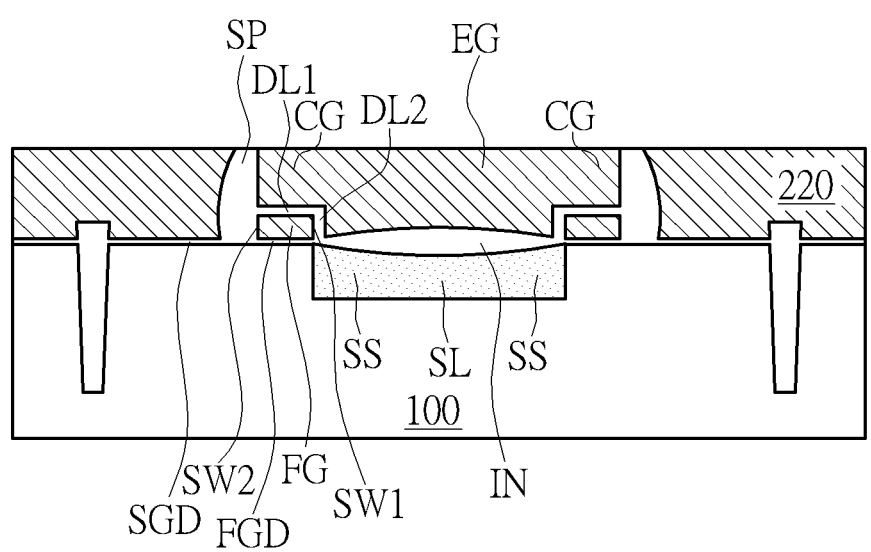

As shown in FIG. 11, subsequently, a chemical mechanical polishing (CMP) process is performed to planarize the polysilicon layer 220 until the top surfaces of the spacers SP are exposed.

Figure 12:
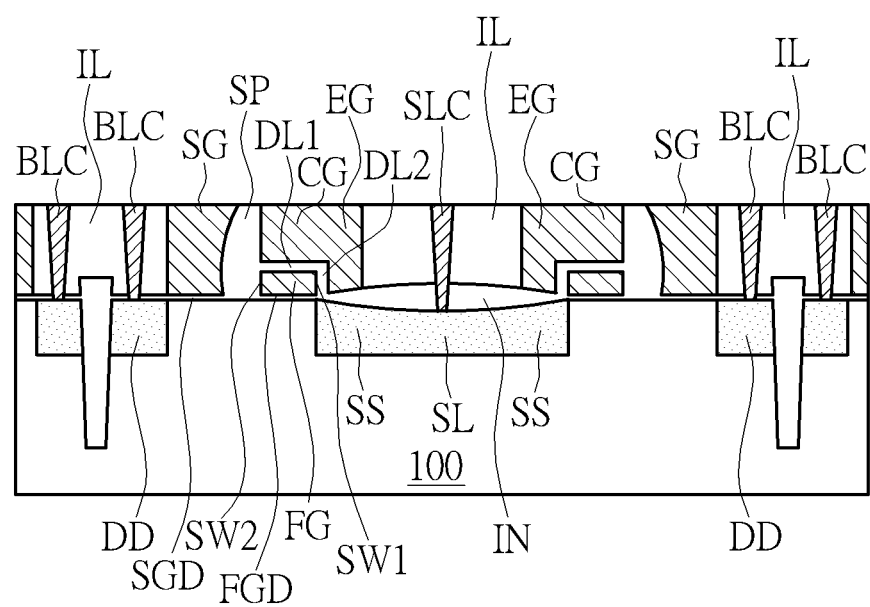

As shown in FIG. 12, subsequently, a lithography process and an etching process are performed to pattern the polysilicon layer 220, and the select gate SG and the merged control gate CG and the erase gate EG are defined. Subsequently, a drain doped region DD adjacent to the select gate SG is formed. A dielectric layer IL surrounding the select gate SG and the erase gate EG is then formed. Finally, source line contact SLC and bit line contacts BLC are formed by using a lithography process, an etching process and a metallization process.

As shown in FIG. 12, the memory cell MC of the present invention includes a substrate 100; a floating gate FG on the substrate 100; a control gate CG on the floating gate FG; a first dielectric layer DL1 between the floating gate FG and the control gate CG; an erase gate EG merged with the control gate CG and disposed on the first sidewall SW1 of the floating gate FG; a second dielectric layer DL2 between the floating gate FG and the erase gate EG; a select gate SG on the opposite second sidewall SW2 of the floating gate FG; a spacer SP between the select gate SG and the control gate CG and between the select gate SG and the floating gate FG; a source doped region SS in the substrate 100 and adjacent to the first sidewall SW1 of the floating gate FG; and a drain doped region DD in the substrate 100 and adjacent to the select gate SG.

According to an embodiment of the present invention, the first dielectric layer DL1 is thicker than the second dielectric layer DL2.

According to an embodiment of the present invention, the first dielectric layer DL1 includes an oxide-nitride-oxide (ONO) dielectric layer.

According to an embodiment of the present invention, the second dielectric layer DL2 is a silicon oxide layer.

According to an embodiment of the present invention, the erase gate EG partially overlaps with the source doped region SS.

According to an embodiment of the present invention, the memory cell MC further includes a source line contact SLC disposed on the source doped region SS; and a bit line contact BLC disposed on the drain doped region DD.

According to an embodiment of the present invention, the memory cell MC further includes an insulating layer IN, which is disposed between the substrate 100 and the erase gate EG, wherein the insulating layer IN has a thickness that increases in a direction from the first sidewall SW1 of the floating gate FG to the source line contact SLC.

According to an embodiment of the present invention, the erase gate EG and the control gate CG are structurally integrated.

According to an embodiment of the present invention, the erase gate EG, the control gate CG, the floating gate FG and the select gate SG are formed of polysilicon.

According to an embodiment of the present invention, the memory cell MC further includes a select gate oxide layer SGD disposed between the select gate SG and the substrate 100; and a floating gate oxide layer FGD disposed between the floating gate FG and the substrate 100.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
    a substrate;
    a plurality of device lines comprising a select gate (SG) line, a control gate (CG) line, an erase gate (EG) line, and a source line elongated in parallel along a first direction from a top view, wherein the CG line is disposed between the EG line and the SG line, the EG line is merged with the CG line, and the source line underlies the EG line in the substrate, wherein the plurality of device lines defines a plurality of memory cells, wherein each of the plurality of memory cells comprises a floating gate disposed under the CG line;
    a plurality of drain doping regions of the plurality of memory cells disposed in the substrate and adjacent to the SG line;
    a plurality of bit line contacts disposed on the plurality of drain doping regions of the plurality of memory cells, respectively;

a plurality of source doping regions of the plurality of memory cells electrically coupled to the source line in the substrate and disposed under the EG line, wherein each of the plurality of source doping regions is disposed adjacent to a first sidewall of the floating gate;

a plurality of source line contacts disposed on the plurality of source doping regions of the plurality of memory cells, respectively, wherein the plurality of source line contacts is aligned with the plurality of bit line contacts in a second direction that is orthogonal to the first direction from the top view;

a first dielectric layer disposed between the floating gate and the CG line; and a second dielectric layer disposed between the floating gate and the EG line, wherein the first dielectric layer is thicker than the second dielectric layer.

2. The semiconductor memory device according to claim 1, wherein the EG line partially overlaps with the source line when viewed from above.

3. The semiconductor memory device according to claim 1, wherein the first dielectric layer comprises an oxide-nitride-oxide (ONO) dielectric layer.

4. The semiconductor memory device according to claim 1, wherein the second dielectric layer is a silicon oxide layer.

5. The semiconductor memory device according to claim 1, wherein the second dielectric layer is disposed only on the first sidewall of the floating gate.

* * * * *